(12) United States Patent
Origuchi et al.

(10) Patent No.: US 8,130,507 B2
(45) Date of Patent: Mar. 6, 2012

(54) COMPONENT BUILT-IN WIRING BOARD

(75) Inventors: Makoto Origuchi, Komaki (JP);
Tsuneaki Takashima, Iwakura (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 278 days.

(21) Appl. No.: 12/409,143

(22) Filed: Mar. 23, 2009

(65) Prior Publication Data
US 2009/0237900 A1   Sep. 24, 2009

(30) Foreign Application Priority Data
Mar. 24, 2008 (JP) .................... 2008-075169

(51) Int. Cl.
*H05K 7/00* (2006.01)

(52) U.S. Cl. ........ 361/760; 361/761; 361/763; 361/523; 361/540; 361/748; 361/768; 174/260; 257/668; 257/676; 257/686; 257/777; 257/787

(58) Field of Classification Search .......... 361/760, 361/761, 763, 523, 540, 748, 768; 257/668, 257/676, 686, 777, 787; 174/260
See application file for complete search history.

(56) References Cited

U.S. PATENT DOCUMENTS

| | | | |
|---|---|---|---|
| 6,740,411 B2 * | 5/2004 | Kojima et al. ............ | 428/413 |
| 6,809,268 B2 * | 10/2004 | Hayashi et al. .......... | 174/260 |
| 6,876,554 B1 * | 4/2005 | Inagaki et al. .......... | 361/763 |
| 6,896,998 B2 * | 5/2005 | Mizukoshi ............... | 430/22 |
| 6,974,724 B2 * | 12/2005 | Hyvonen et al. ........ | 438/107 |
| 7,078,788 B2 * | 7/2006 | Vu et al. ................. | 257/668 |
| 7,089,660 B2 * | 8/2006 | Hsu et al. ................ | 29/830 |
| 7,282,394 B2 * | 10/2007 | Cho et al. ............... | 438/118 |
| 7,377,030 B2 * | 5/2008 | Shuto et al. ............. | 29/830 |
| 7,420,128 B2 * | 9/2008 | Sunohara et al. ....... | 174/260 |
| 7,462,784 B2 * | 12/2008 | Kariya et al. ........... | 174/260 |
| 7,473,988 B2 * | 1/2009 | Urashima et al. ....... | 257/668 |
| 7,613,007 B2 * | 11/2009 | Amey et al. ............. | 361/763 |
| 7,704,548 B2 * | 4/2010 | Kawabe et al. ......... | 427/96.1 |
| 2002/0020898 A1 * | 2/2002 | Vu et al. ................. | 257/676 |
| 2002/0149098 A1 * | 10/2002 | Seyama et al. .......... | 257/686 |
| 2004/0014317 A1 | 1/2004 | Sakamoto et al. | |
| 2005/0062173 A1 * | 3/2005 | Vu et al. ................. | 257/787 |

(Continued)

FOREIGN PATENT DOCUMENTS
JP    2003 309243    10/2003

*Primary Examiner* — Xiaoliang Chen
(74) *Attorney, Agent, or Firm* — Stites & Harbison PLLC; Jeffrey A. Haeberlin

(57) ABSTRACT

A component built-in wiring board is provided. The component built-in wiring board 10 includes a core substrate 11, a first component 61, a first built-up layer 31 and a capacitor 101. The core substrate 11 has a housing hole 90 and the first component 61 is housed in the housing hole 90. A component mounting region 20 capable of mounting a second component 21 is provided in a surface 39 of the first built-up layer 31. The capacitor 101 has electrode layers 102 and 103 and a dielectric layer 104. The capacitor 101 is embedded in the first built-up layer 31 such that a first front surface 105 and a second front surface 106 in the electrode layer 102 and a first front surface 107 and a second front surface 108 in the electrode layer 103 are disposed in parallel with the surface 39 of the first built-up layer 31.

3 Claims, 8 Drawing Sheets

U.S. PATENT DOCUMENTS

| | | | |
|---|---|---|---|
| 2005/0231889 A1* | 10/2005 | Tsuji | 361/306.2 |
| 2005/0280978 A1* | 12/2005 | Sakaguchi et al. | 361/523 |
| 2006/0130303 A1* | 6/2006 | Yamasaki et al. | 29/25.41 |
| 2006/0243478 A1* | 11/2006 | Inagaki et al. | 174/255 |
| 2006/0244134 A1* | 11/2006 | Inagaki et al. | 257/734 |
| 2007/0025092 A1* | 2/2007 | Lee et al. | 361/761 |
| 2007/0076392 A1* | 4/2007 | Urashima et al. | 361/763 |
| 2007/0121273 A1* | 5/2007 | Yamamoto et al. | 361/306.2 |
| 2007/0257761 A1* | 11/2007 | Mano et al. | 336/200 |
| 2008/0030965 A1* | 2/2008 | Lien et al. | 361/748 |
| 2008/0164597 A1* | 7/2008 | Hsu et al. | 257/690 |
| 2008/0197469 A1* | 8/2008 | Yang et al. | 257/686 |
| 2008/0210460 A1* | 9/2008 | Lien et al. | 174/260 |
| 2008/0218985 A1* | 9/2008 | Takeda | 361/768 |
| 2008/0230260 A1* | 9/2008 | Shih | 174/257 |
| 2008/0230886 A1* | 9/2008 | Wong et al. | 257/686 |
| 2008/0246135 A1* | 10/2008 | Wong et al. | 257/686 |
| 2009/0065245 A1* | 3/2009 | Hsu | 174/260 |
| 2009/0122470 A1* | 5/2009 | Matsuoka et al. | 361/540 |
| 2009/0243065 A1* | 10/2009 | Sugino et al. | 257/686 |

\* cited by examiner

COMPONENT BUILT-IN WIRING BOARD

CROSS-REFERENCE TO RELATED APPLICATIONS

This application claims priority from Japanese Patent Application No. 2008-075169, filed on Mar. 24, 2008, the entire contents of which are hereby incorporated by reference.

BACKGROUND OF THE INVENTION

1. Technical Field

Devices consistent with the present invention relate to a component built-in wiring board which includes a capacitor having an electrode layer and a dielectric layer.

2. Related Art

In recent years, a semiconductor integrated circuit device (an IC chip) to be used as a microprocessor of a computer has been enhanced in a speed and a function increasingly. Incidentally, there is a tendency that the number of terminals is increased and a pitch between the terminals is also reduced. In general, a large number of terminals are densely disposed in an array on a bottom surface of the IC chip, and the terminal group is connected to a terminal group on a mother board side by flip chip bonding. The pitch between the terminals has a great difference for the terminal group on the IC chip side and the terminal group on the mother board side. For this reason, it is hard to directly connect the IC chip onto the mother board. Therefore, there is usually employed a technique for fabricating a package including an IC chip in a core substrate of a wiring board (see e.g., JP-A-2003-309243 (e.g., FIG. 1), JP-A-2002-246761 (e.g., FIG. 14)) or a package having an IC chip mounted on a wiring board, and mounting the package on a mother board. In a wiring board constituting the package of this type, it has been proposed to provide a capacitor (or condenser) in order to reduce a switching noise and to stabilize a power voltage in the IC chip. As an example, there has been provided a wiring board in which a chip-shaped capacitor is embedded in a core substrate and a build-up layer is formed on a front surface and a back surface of the core substrate.

In the case, although a component such as an IC chip is included in a core substrate, a space in the core substrate is occupied by the IC chip. Therefore, it is hard to embed a capacitor in the core substrate. For this reason, the capacitor is to be mounted on a wiring board. Even if the capacitor can be embedded in the core substrate, moreover, it is necessary to dispose the capacitor to keep away from the IC chip. As a result, a length of a wiring for connecting the capacitor to the IC chip is likely to be increased. Therefore, an inductance component of the wiring is likely to be increased. Consequently, it is impossible to reliably reduce a switching noise of the IC chip by the capacitor and to surely stabilize a power voltage.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a component built-in wiring board which can eliminate a drawback caused by an increase in a length of a wiring for connecting a component to a capacitor.

According to exemplary embodiments of the present invention, a component built-in wiring board is provided. The component built-in wiring board comprises: a core substrate having a core front surface and a core back surface opposite to the core front surface, the core substrate comprising a housing hole opened on at least the core front surface side; a first component having a component front surface and a component back surface opposite to the component front surface, wherein the first component is housed in the housing hole such that the core front surface and the component front surface are directed to the same direction; a first built-up layer formed on the core front surface of the core substrate, the first built-up layer comprising a plurality of insulating layers and a plurality of wiring layers, wherein a surface of the first built-up layer has a component mounting region on which a second component electrically connected to the first component is mounted; a second built-up layer formed on the core back surface of the core substrate, the second built-up layer comprising a plurality of insulating layers and a plurality of wiring layers; and a capacitor comprising: an electrode layer; a dielectric layer formed on the electrode layer, wherein the capacitor is embedded in at least one of the first built-up layer and the second built-up layer such that the capacitor is in parallel with a surface of the at least one of the first built-up layer and the second built-up layer.

According to the component built-in wiring board, therefore, the capacitor is embedded in at least one of the first built-up layer and the second built-up layer. Even if the first component is housed in the housing hole of the core substrate, consequently, a wiring for connecting the first component to the capacitor is shortened. As a result, it is possible to prevent an increase in an inductance component of the wiring. Therefore, it is possible to eliminate a drawback caused by an increase in a length of the wiring.

The core substrate is formed to have a plate shape having the core front surface and the core back surface. Further, the core substrate has the housing hole for accommodating the first component. The housing hole may be a non-through hole opened on only the core front surface side or a through hole opened on both the core front surface side and the core back surface side. Although the first component may be housed in the housing hole such that it is perfectly embedded therein or may be housed in the housing hole such that it is partially protruded from an opening portion of the housing hole, it is advantageous that the first component should be housed in the housing hole such that it is perfectly embedded therein. Thus, it is possible to prevent the first component from being protruded from the opening portion of the housing hole. Accordingly, it is possible to flatten the surface of the first built-up layer formed on the core front surface and the surface of the second built-up layer formed on the core back surface. Consequently, it is possible to enhance precision in dimensions of the first built-up layer and the second built-up layer.

Although a material for forming the core substrate is not particularly restricted, it is advantageous that core substrate is formed of a polymeric material as a main component. For example, the polymeric material for forming the core substrate may include an EP resin (epoxy resin), a PI resin (polyimide resin), a BT resin (bismaleimide triazine resin) and a PPE resin (polyphenylene ether resin). In addition, it is also possible to use a composite material of the resins and an organic fiber such as a glass fiber (a glass woven fabric or a nonwoven glass fabric) or a polyamide fiber.

The first component has the component front surface and the component back surface. Although the first component is formed into any shape, it is advantageous that the first component is formed into a plate shape in which an area of the component front surface is larger than that side surfaces thereof, for example. When the first component is housed in the housing hole, thus, a distance between the internal wall surface of the housing hole and the component side surface of the first component is reduced. Therefore, it is not necessary to greatly increase a volume of a resin filler filled in the housing hole.

For example, the first component may include a semiconductor integrated circuit device (IC chip) and a Micro Electro Mechanical Systems (MEMS) device manufactured in a semiconductor manufacturing process. Furthermore, the IC chip may include a Dynamic Random Access Memory (DRAM) and a Static Random Access Memory (SRAM). The "semiconductor integrated circuit device" is mainly used as a microprocessor of a computer.

According to the first built-up layer, the insulating layers, which are formed of polymeric material as a main component, and the wiring layers are alternately formed on the core front surface. Meanwhile, according to the second built-up layer, the insulating layers, which are formed of polymeric material as a main component, and the wiring layers are alternately formed on the core back surface.

The insulating layers may be properly selected in consideration of an insulating property, a heat resistance and a moisture resistance. For example, the polymeric material for forming the insulating layers may include a thermosetting resin such as an epoxy resin, a phenol resin, an urethane resin, a silicone resin, a polyimide resin, a bismaleimide-triazine resin, a xylene resin or a polyester resin and a thermoplastic resin such as a polycarbonate resin, an acrylic resin, a polyacetal resin or a polypropylene resin.

The wiring layers may be formed of conductive metallic material. For example, the metallic material may include copper, silver, iron, cobalt and nickel. In particular, it is advantageous that the wiring layers should be formed of inexpensive copper having a high conductivity. Moreover, it is advantageous that the wiring layers should be formed by plating. Thus, it is possible to easily form the wiring layers at a low cost. However, the wiring layers may be formed by printing a metal paste.

The first built-up layer has a surface to which the component mounting region is provided. The second component, which is electrically connected to the first component, can be mounted on the component mounting region. The "component mounting region" is positioned under the lower surface of the second component when the second component is mounted, and takes almost the same external shape as that of the lower surface of the second component. Moreover, the area of the component mounting region is set to be equal to or smaller than that of the lower surface of the second component. The "component mounting region" implies a region where a plurality of terminals exposed to the surface of the first built-up layer is provided. For example, second component may include the IC chip (the DRAM or the SRAM) and the MEMS device.

It is advantageous that the capacitor should have the electrode layers and the dielectric layer and should be a sheet-shaped capacitor which is embedded in at least one of the first built-up layer and the second built-up layer. Even if the capacitor is embedded in the first built-up layer or the second built-up layer, thus, the thickness of the component built-in wiring board is increased with difficulty. Although the capacitor may be embedded in only the first built-up layer, only the second built-up layer or both the first built-up layer and the second built-up layer, it is advantageous that the capacitor should be embedded in at least the first built-up layer. Consequently, the wiring for connecting the first component to the capacitor is shortened, and furthermore, the wiring for connecting the second component mounted on the component mounting region to the capacitor is also shortened. Therefore, it is possible to prevent the increase in the inductance component of the wiring more reliably.

For example, the electrical connection of the capacitor to the component mounting region may include an electrical connection of the capacitor to the power terminal present in the component mounting region through the power wiring provided in the first built-up layer, and an electrical connection of the capacitor to the ground terminal present in the component mounting region through the ground wiring provided in the first built-up layer.

Although the thickness of the whole capacitor is not particularly restricted, it is sufficient that the thickness is equal to or greater than 1 µm and is equal to or smaller than 100 µm and it is advantageous that the thickness should be equal to or greater than 5 µm and should be equal to or smaller than 75 µm. When the thickness of the whole capacitor is smaller than 1 µm, a sufficient strength cannot be maintained and the capacitor is hard to handle as a single capacitor. On the other hand, when the thickness of the whole capacitor is greater than 100 µm, there is a possibility that an increase in a density and a reduction in a size of the component built-in wiring board might be inhibited from being achieved. When the capacitor is provided in the component built-in wiring board, moreover, a step is likely to be generated. Therefore, there is a possibility that a smoothness of the substrate surface might be ensured with difficulty. As a result, there is a possibility that a connecting reliability of the second component mounted on the substrate surface and the component built-in wiring board might be deteriorated.

Although the electrode layer or the dielectric layer in the capacitor may be constituted by only one layer or may be constituted by two layers or more, it is advantageous that the number of the electrode layers or the dielectric layers should be small. If the number of the electrode layers or the dielectric layers is increased, it is impossible to increase the density and to reduce the size (to reduce a thickness) in the component built-in wiring board while it is possible to increase a capacity of the capacitor. In this case, therefore, it is advantageous that an external dimension of the capacitor should be set to be larger than that of the first component and that of the component mounting region, and a region in which the capacitor is provided should include a region in which the first component is provided and the component mounting region when viewed from the thickness direction of the component built-in wiring board. Also, when the thickness of the component built-in wiring board is reduced, consequently, it is possible to increase the capacity of the capacitor by setting the external dimension of the capacitor to be large.

For example, material for forming the electrode layer may include silver, gold, platinum, copper, titanium, aluminum, palladium, nickel and tungsten. In particular, it is advantageous to use the nickel having a comparatively high melting point. In this case, if the dielectric layer is formed by ceramic having a high dielectric constant, it can be simultaneously burnt together with the dielectric layer. Moreover, the electrode layer is formed of comparatively inexpensive material. Therefore, it is possible to reduce a cost of the capacitor.

It is advantageous that the thickness of the electrode layer should be equal to or greater than 0.1 µm and should be equal to or smaller than 50 µm, for example. If the thickness of the electrode layer is smaller than 0.1 µm, there is a possibility that the electrical reliability might be ensured with difficulty.

On the other hand, if the thickness of the electrode layer is greater than 50 μm, there is a possibility that the thickness of the whole capacitor might be increased. If the thickness is set in a range of 0.1 μm or more to 50 μm or less, it is possible to prevent an increase in the thickness of the whole capacitor while ensuring the electrical reliability.

The dielectric layer indicates a layer containing an inorganic substance having a high dielectric constant (for example, dielectric ceramic) as a main component. The dielectric ceramic implies ceramic having a high dielectric constant (which is defined to be ceramic having a dielectric constant of 10 or more), and composite oxide having a crystal structure of a perovskite type corresponds thereto, for example. For example, the composite oxide may include a compound constituted by at least one selected from barium titanate, lead titanate and strontium titanate.

It is sufficient that the thickness of the dielectric layer is equal to or greater than 0.1 μm and is equal to or smaller than 50 μm, for example, and it is advantageous that the thickness should be equal to or greater than 0.5 μm and should be equal to or smaller than 20 μm. It is advantageous that the thickness of the dielectric layer is reduced to increase the capacity of the capacitor. Meanwhile, when the thickness of the dielectric layer is excessively reduced to be smaller than 0.1 μm, there is a possibility that insulation between the electrode layers might be maintained with difficulty if at least two electrode layers are provided. On the other hand, when the thickness of the dielectric layer is greater than 50 μm, there is a possibility that the increase in the capacity might be achieved with difficulty and the thickness of the whole capacitor might be increased.

When the first component and a signal terminal present in the component mounting region are electrically connected to each other through a signal wiring provided in the first built-up layer, it is advantageous that a through hole should be formed to penetrate the capacitor in the thickness direction thereof and the signal wiring should be disposed in the through hole in a non-contact state with an internal wall surface of the through hole. Also, when the external dimension of the capacitor is increased, consequently, the first component and the second component mounted on the component mounting region can be electrically connected to each other reliably.

A conventional method can be employed for the method of forming a through hole. For example, the method may include an etching processing, a laser processing, a cut processing, a drill processing and a punching processing.

Furthermore, it is advantageous that a component mounting portion on which a surface mounting component is mounted should be set to a surface of the first built-up layer or a surface of the second built-up layer, the first component and the power terminal present in the component mounting portion should be electrically connected to each other through a power wiring provided in the first built-up layer or the second built-up layer, and the first component and the ground terminal present in the component mounting portion should be electrically connected to each other through a ground wiring provided in the first built-up layer or the second built-up layer. Consequently, it is possible to achieve the increase in the density of the component built-in wiring board by mounting the surface mounting component on the component mounting portion.

For example, surface mounting component may include a chip capacitor, a register, the IC chip (the DRAM or the SRAM) and the MEMS device.

The "component mounting portion" indicates a region positioned just above the upper surface of the surface mounting component when the surface mounting component is mounted, and takes almost the same external shape as the upper surface of the surface mounting component. Moreover, the area of the component mounting portion is set to be equal to or smaller than that of the upper surface of the surface mounting component. Also, the "component mounting portion" indicates a region in which a plurality of terminals exposed to the surface of the second built-up layer is present. It is advantageous that the shape of the component mounting portion should be almost the same as that of the component mounting region.

DETAILED DESCRIPTION OF EXEMPLARY EMBODIMENT OF THE INVENTION

Exemplary embodiments of the present invention will be now described with reference to the drawings.

Figure 1:
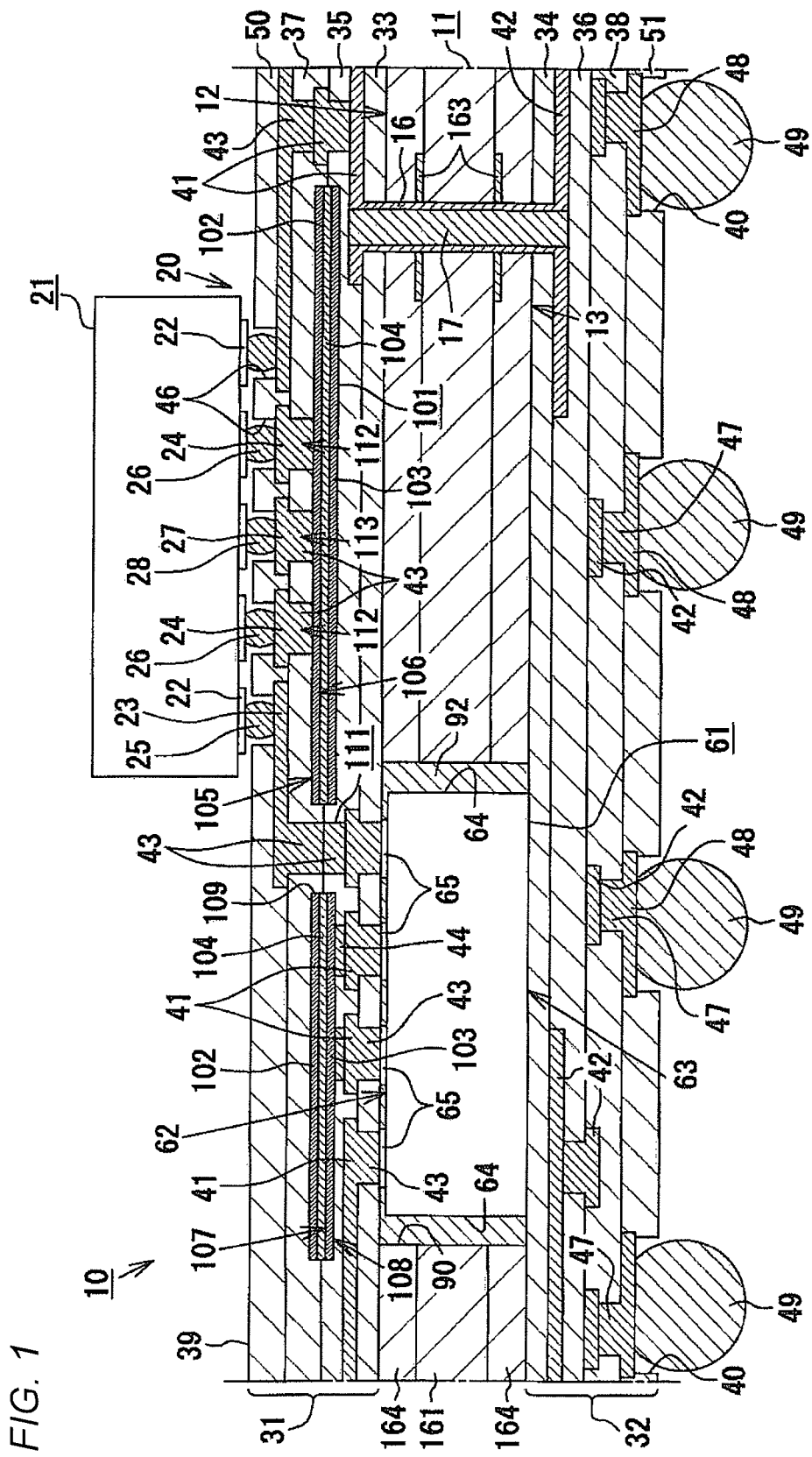
FIG. 1 is a schematic sectional view showing a wiring board according to an exemplary embodiment of the present invention.

As shown in FIG. 1, a component built-in wiring board according to the exemplary embodiment (which will be hereinafter referred to as a "wiring board") 10 is a wiring board for integrating an IC chip. The wiring board 10 is constituted by a core substrate 11 having a shape of an almost rectangular plate, a first built-up layer 31 formed on a core front surface 12 (an upper surface in FIG. 1) of the core substrate 11, and a second built-up layer 32 formed on a core back surface 13 (a lower surface in FIG. 1) of the core substrate 11.

The core substrate 11 according to the exemplary embodiment has a shape of an almost rectangular plate seen on a plane in a length of 25 mm, a width of 25 mm and a thickness of 1.0 mm. The core substrate 11 has a coefficient of thermal expansion in a planar direction (an XY direction) which is approximately 10 to 30 ppm/° C. (more specifically, 18 ppm/° C.). The coefficient of thermal expansion of the core substrate 11 has a mean measured value of 0° C. to a glass transition temperature (Tg). The core substrate 11 is constituted by a base material 161 formed of glass epoxy, a sub base material 164 provided on upper and lower surfaces of the base material 161 and formed by an epoxy resin to which an inorganic filler such as a silica filler is added, and a conductor layer 163 provided on the upper and lower surfaces of the base material 161 and formed of copper. Moreover, a plurality of through hole conductors 16 are formed on the core substrate 11 to penetrate the core front surface 12, the core back surface 13 and the conductor layer 163. The through hole conductor 16 connects and conducts the core front surface 12 side of the core substrate 11 to the core back surface 13 side and electrically connects them to the conductor layer 163. An inner part of the through hole conductor 16 is filled with a blocking body 17 such as an epoxy resin. Furthermore, the core substrate 11 has a single housing hole 90 opened in a central part of the core back surface 13 and that of the core front surface 12 and having a rectangular shape seen on a plane. In other words, the housing hole 90 is a through hole.

As shown in FIG. 1, an IC chip 61 (a semiconductor integrated circuit device) to be a first component is housed in the housing hole 90 in a embedded state. The IC chip 61 is housed such that the core front surface 12 of the core substrate 11 and a chip front surface 62 are directed to the same direction. The IC chip 61 according to the exemplary embodiment is formed into a plate-shape, for example, a rectangular shape seen on a plane in a length of 10.0 mm, a width of 10.0 mm and a thickness of 0.9 mm and is formed of silicon which has a coefficient of thermal expansion of approximately 3 to 4 ppm/° C. (more specifically, approximately 3.5 ppm/° C.). The IC chip 61 has the single chip front surface 62 (an upper surface in FIG. 1) to be a component front surface, a single chip back surface 63 (a lower surface in FIG. 1) to be a component back surface, and four chip side surfaces 64. Moreover, a surface connecting terminal 65 is protruded from a plurality of places on the chip back surface 63.

A clearance between the housing hole 90 and the IC chip 61 is filled with a resin filler 92 formed by a polymeric material (an epoxy resin to be the thermosetting resin according to the exemplary embodiment). The resin filler 92 has a function for fixing the IC chip 61 to the core substrate 11.

As shown in FIG. 1, in the first built-up layer 31 formed on the core front surface 12 of the core substrate 11, three insulating layers 33, 35 and 37 formed of the thermosetting resin (the epoxy resin) and a wiring layer 41 formed of copper are formed alternately. In the exemplary embodiment, the first built-up layer 31 has a coefficient of thermal expansion of approximately 10 to 60 ppm/° C. (more specifically, approximately 20 ppm/° C.). The coefficient of thermal expansion of the first built-up layer 31 indicates a mean measured value of 30° C. to the glass transition temperature (Tg). Moreover, a via conductor 43 formed by copper plating is provided in the insulating layers 33, 35 and 37. Furthermore, a via conductor 44 formed of a cured substance of a copper paste, which is a kind of a conductive paste, is provided in the insulating layer 35. An upper end of the through hole conductor 16 is electrically connected to a part of the wiring layer 41 provided on a surface of the insulating layer 33 to be a first layer. Moreover, a part of the via conductor 43 provided in the insulating layer 33 is connected to the surface connecting terminal 65 of the IC chip 61.

A signal terminal pad 23 constituting a signal terminal, a power terminal pad 24 constituting a power terminal and a ground terminal pad 27 constituting a ground terminal are formed in an array in a plurality of areas on a surface of the insulating layer 37 to be a third layer. Furthermore, the surface of the insulating layer 37 is covered almost wholly with a solder resist 50. An opening portion 46 for exposing the terminal pads 23, 24 and 27 is formed in a predetermined place of the solder resist 50. A signal solder bump 25 constituting the signal terminal is provided on a surface of the signal terminal pad 23, a power solder bump 26 constituting a power terminal is provided on a surface of the power terminal pad 24, and a ground solder bump 28 constituting a ground terminal is provided on a surface of the ground terminal pad 27. Each of the solder bumps 25, 26 and 28 is electrically connected to a surface connecting terminal 22 of an IC chip 21 (a semiconductor integrated circuit device) to be a second component. The IC chip 21 according to the exemplary embodiment is formed into a plate-shape, for example, a rectangular shape seen on a plane in a length of 12.0 mm, a width of 12.0 mm and a thickness of 0.9 mm and is formed of silicon which has a coefficient of thermal expansion of approximately 3 to 4 ppm/° C. (more specifically, approximately 3.5 ppm/° C.). The terminal pads 23, 24 and 27 and the solder bumps 25, 26 and 28 are present in a component mounting region 20 where the IC chip 21 is mounted. The component mounting region 20 is provided to a surface 39 of the first built-up layer 31 and has a rectangular shape seen on a plane in a length of 12.0 mm and a width of 12.0 mm.

As shown in FIG. 1, the second built-up layer 32 formed on the core back surface 13 of the core substrate 11 has almost the same structure as the first built-up layer 31. More specifically, the second built-up layer 32 has a coefficient of thermal expansion of approximately 10 to 60 ppm/° C. (more specifically, approximately 20 ppm/° C.) and has a structure in which three insulating layers 34, 36 and 38 formed of a thermosetting resin (an epoxy resin) and a wiring layer 42 are alternately formed. Moreover, a via conductor 47 formed by copper plating is provided in the insulating layers 34, 36 and 38, respectively. A lower end of the through hole conductor 16 is electrically connected to a part of the wiring layer 42 provided on a lower surface of the insulating layer 34 to be a first layer. Furthermore, a pad 48 for a BGA to be electrically connected to the wiring layer 42 through the via conductor 47 is formed like a grid in a plurality of areas on a lower surface of the insulating layer 38 to be a third layer. Moreover, the lower surface of the insulating layer 38 is covered almost wholly with a solder resist 51. An opening portion 40 for exposing the pad 48 for a BGA is formed in given portions of the solder resist 51. A plurality of solder bumps 49 for carrying out an electrical connection to a mother board (not shown) is provided on a surface of the pad 48 for a BGA. With the solder bump 49, the wiring board 10 shown in FIG. 1 is mounted on the mother board (not shown).

Figure 2:
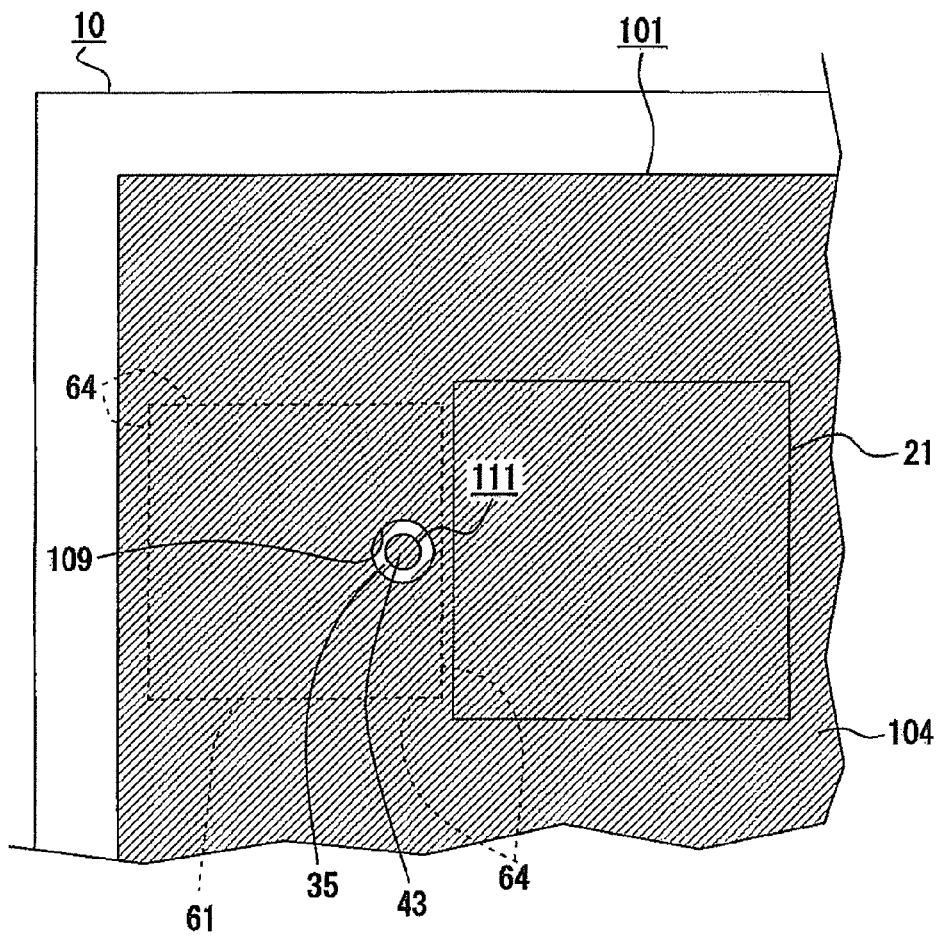
FIG. 2 is an explanatory view showing a positional relationship between a ceramic capacitor and an IC chip.

As shown in FIGS. 1 and 2, a sheet-shaped ceramic capacitor 101 is embedded in an interface between the insulating layers 35 and 37 which are adjacent to each other in the first built-up layer 31. The ceramic capacitor 101 according to the exemplary embodiment is formed into a plate-shape, for example, a rectangular shape seen on a plane in a length of 24.0 mm, a width of 24.0 mm and a thickness of 0.02 mm. In other words, an external dimension of the ceramic capacitor 101 is set to be larger than that of the IC chip 61 and that of the component mounting region 20. When the wiring board 10 is seen in a thickness direction, moreover, a region in which the IC chip 61 is provided and the component mounting region 20 are included in a region in which the ceramic capacitor 101 is provided (see FIG. 2). In other words, the ceramic capacitor 101 is disposed between the IC chip 61 and the component mounting region 20. The IC chip 61 according to the exemplary embodiment is not disposed under the IC chip 21 mounted on the component mounting region 20.

As shown in FIG. 1, in the ceramic capacitor 101, two nickel electrode layers 102 and 103 interpose a single dielectric layer 104 formed of barium titanate therebetween. In the exemplary embodiment, the first nickel electrode layer 102 and the second nickel electrode layer 103 are set to have a thickness of 8 μm and the dielectric layer 104 is set to have a thickness of 4 μm. Moreover, a coefficient of thermal expansion of the dielectric layer 104 is lower than 15 ppm/° C., more specifically, approximately 12 to 13 ppm/° C. The coefficient of thermal expansion of the dielectric layer 104 indicates a mean measured value of 30° C. to 250° C.

The first nickel electrode layer 102 has a first front surface 105 and a second front surface 106 which are disposed in parallel with the surface 39 of the first built-up layer 31. The first front surface 105 of the first nickel electrode layer 102 is provided in face contact with the insulating layer 37, and the dielectric layer 104 is formed on the second front surface 106 of the first nickel electrode layer 102. The first nickel electrode layer 102 is electrically connected to the power terminal pad 24 and the power solder bump 26 through a power wiring 112 provided in the first built-up layer 31. Moreover, the second nickel electrode layer 103 is electrically connected to the ground terminal pad 27 and the ground solder bump 28 through a ground wiring 113 provided in the first built-up layer 31. The wirings 112 and 113 are constituted by the via conductor 43 provided in the insulating layer 37.

As shown in FIG. 1, the second nickel electrode layer 103 has a first front surface 107 and a second front surface 108 which are disposed in parallel with the surface 39 of the first built-up layer 31. The dielectric layer 104 is formed on the first front surface 107 of the second nickel electrode layer 103, and the second front surface 108 of the second nickel electrode layer 103 is provided in face contact with the insulating layer 35. The second nickel electrode layer 103 is connected to an upper end face of the via conductor 44 provided in the insulating layer 35.

When applying current to the ceramic capacitor 101 having the above structure and applying a given voltage between the first nickel electrode layer 102 and the second nickel electrode layer 103, a positive charge is stored in one of the electrode layers and a negative charge is stored in the other electrode layer.

As shown in FIGS. 1 and 2, a through hole 109 penetrating the ceramic capacitor 101 in a thickness direction thereof is formed in a plurality of places of the ceramic capacitor 101. Although a shape of the through hole 109 is not particularly restricted, the through hole 109 according to the exemplary embodiment has a circular shape seen in the thickness direction of the ceramic capacitor 101 (see FIG. 2). A part of the insulating layers 35 and 37 is provided in each through hole 109. Moreover, a single signal wiring 111 is disposed in each through hole 109. The signal wiring 111 is disposed in non-contact with an internal wall surface of the through hole 109. The signal wiring 111 is constituted by the wiring layer 41 and the via conductor 43. The signal wiring 111 serves to electrically connect the IC chip 61 to the signal terminal (the signal terminal pad 23 and the signal solder bump 25). Accordingly, the IC chip 21 to be connected to the signal solder bump 25 is electrically connected to the IC chip 61 through the signal wiring 111.

Next, description will be given to a method of manufacturing the wiring board 10 according to the exemplary embodiment.

At a core substrate preparing step, an intermediate product of the core substrate 11 is fabricated by a conventional technique and is prepared in advance.

The intermediate product of the core substrate 11 is fabricated in the following manner. First of all, there is prepared a copper-clad laminate (not shown) having a copper foil laminated on both sides of the base material 161 having a length of 400 mm, a width of 400 mm and a thickness of 0.8 mm. Next, the copper foils on both sides of the copper-clad laminate are subjected to etching so as to pattern the conductor layer 163 by a subtractive process, for example. More specifically, non-electrolytic copper plating is carried out and electrolytic copper plating is then carried out using the nonelectrolytic copper plated layer as a common electrode. Furthermore, a dry film is laminated to carry out an exposure and a development over the dry film so that the dry film is formed into a certain pattern. In this state, the electrolytic copper plated layer, the nonelectrolytic copper plated layer and the copper foil, which are unnecessary, are removed. Thereafter, the dry film is peeled. Next, the upper and lower surfaces of the base material 161 and the conductor layer 163 are roughened and an epoxy resin film (a thickness of 80 μm) having an inorganic filler added thereto is subsequently bonded to the upper and lower surfaces of the base material 161 through thermal compression bonding, so that the sub base material 164 is formed.

Figure 3:
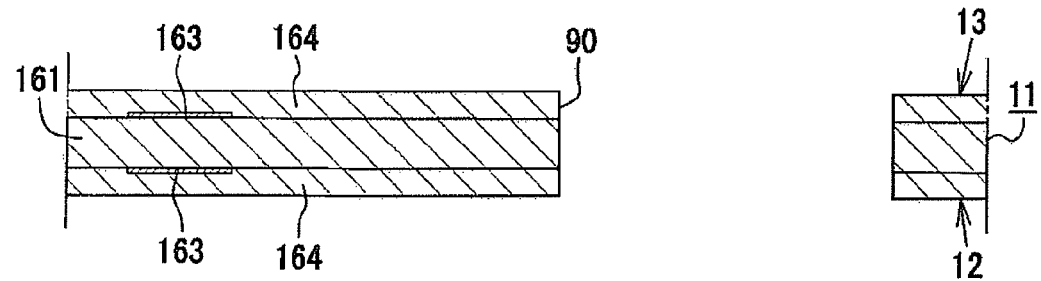
FIG. 3 is an explanatory view showing a method of manufacturing the wiring board.

Then, the laminated body formed by the base material 161 and the sub base material 164 is subjected to perforating by using a router to form a through hole serving as the housing hole 90 in a given position. Consequently, the intermediate product of the core substrate 11 is obtained (see FIG. 3). The intermediate product of the core substrate 11 is a core substrate which is capable of obtaining a plurality of core substrates 11 and in which a plurality of regions to be the core substrate 11 are arranged vertically and transversely in a planar direction.

At an IC chip preparing step, furthermore, the IC chip 21 and the IC chip 61 are fabricated by a conventional technique and are thus prepared in advance.

At a capacitor preparing step, moreover, the ceramic capacitor 101 is fabricated by a conventional technique and is thus prepared in advance.

The ceramic capacitor 101 is fabricated in the following manner. First of all, a dielectric slurry is prepared in accordance with the following procedure. When barium titanate powder (dielectric powder) having a mean particle diameter of 0.7 μm, a mixed solvent of ethanol and toluene, a dispersing agent and a plasticizer are subjected to wet blending in a pot and are mixed sufficiently, an organic binder is added and they are further mixed. Consequently, there is obtained a dielectric slurry to be a starting material in a formation of a dielectric green sheet. At this time, a blending rate of each component is properly changed to prepare the dielectric slurry into a viscosity of approximately 0.5 Pa·s (which is measured on a condition of Viscotester manufactured by RION Co., Ltd., a VT-04 type viscometer, No. 1 rotor, 62.5 rpm, a one-minute value and 25° C.). Next, the dielectric slurry is used to form the dielectric green sheet in the following manner. More specifically, a roll of a PET film having a predetermined width is prepared to set the roll onto a supply side of a casting device, and the dielectric slurry is subjected to casting (coating) thinly in a uniform thickness over an upper surface of the PET film by a conventional technique such as doctor blade or lip coating. Thereafter, the dielectric slurry subjected to the casting to have a sheet shape is heated and dried by means of a heater disposed between a supply side and a wind-up side in the casting device so that a dielectric green sheet having a thickness of 5 μm (an unsintered dielectric layer serving as the dielectric layer 104) is formed.

Moreover, the nickel green sheet is fabricated by almost the same method as that in case of the dielectric green sheet. First of all, a dispersing agent and a plasticizer are added to nickel powder (metal powder) having a mean particle diameter of 0.7 μm. Terpineol is used as the dispersing agent and an organic binder is further added, and they are mixed together. Next, a mixture is used to form the nickel green sheet. More specifically, a roll of a PET film having a certain width is prepared and set onto the supply side of the casting device, and the mixture is cast onto an upper surface of the PET film thinly in a uniform thickness. Thereafter, the mixture cast to have a sheet shape is heated and dried by means of a heater so that a nickel green sheet having a thickness of 9 μm (unsintered electrode layers serving as the nickel electrode layers 102 and 103) is formed.

Subsequently, a punching mold is used to cut the dielectric green sheet and the nickel green sheet into 150 mm square. In this stage, each green sheet has not been cured yet. Therefore, punching can be carried out comparatively easily. In addition, a crack can be prevented from occurring.

Next, the nickel green sheets serving as the nickel electrode layers 102 and 103 are laminated on both sides of the dielectric green sheet serving as the dielectric layer 104, respectively. More specifically, the nickel green sheet having the PET film is laminated and disposed on a single side of the dielectric green sheet (a surface on a side where the PET film is not present). Next, a laminating device is used to apply a pressing force on a condition of 80° C. and 500 kgf/cm$^2$ to carry out contact bonding. After the PET film of the dielectric green sheet is peeled, the nickel green sheet having the PET film is laminated and disposed on a peeled surface of the dielectric green sheet. Then, a pressing force is applied on a condition of 80° C. and 750 kgf/cm$^2$ by using the laminating device to carry out the contact bonding.

Subsequently, laser perforating is carried out over the dielectric green sheet serving as the dielectric layer 104 and the nickel green sheets serving as the nickel electrode layers 102 and 103 while the PET film is maintained to be attached. As a result, the through hole 109 penetrating the dielectric green sheet and the nickel green sheet is formed before burning. Then, the sheets are cut into 25 mm square by means of a general purpose cutting machine and the PET film is then peeled so that an unsintered and laminated body is obtained. In the unsintered and laminated body, the dielectric green sheet and the nickel green sheet are laminated and disposed.

Thereafter, the unsintered and laminated body is degreased at 250° C. for 10 hours in the air, and furthermore, is burnt for a certain time at 1260° C. in a reducing atmosphere. As a result, barium titanate and nickel are heated and sintered at the same time so that a sintered body (the ceramic capacitor 101) is obtained in which the first nickel electrode layer 102 having a thickness of 8 μm, the dielectric layer 104 having a thickness of 4 μm and the second nickel electrode layer 103 having a thickness of 8 μm are laminated in order.

Next, an acetic acid solution containing a silane coupling agent (KBM-403 prepared by Shin-Etsu Chemical Co., Ltd.) in a concentration of 1 wt % is mixed. This is impregnated with the burnt ceramic capacitor 101 for one minute and is then pulled up. Thereafter, the excessive silane coupling agent remaining on the surface is washed away and drying is then carried out at 110° C. for five minutes.

Figure 4:
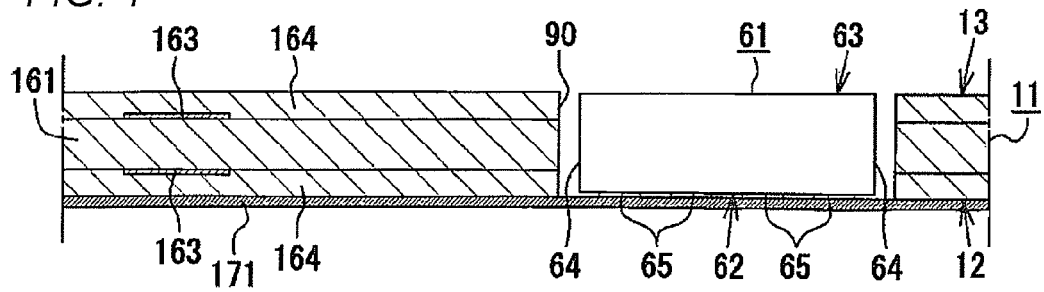
FIG. 4 is an explanatory view showing the method of manufacturing the wiring board.

At a subsequent accommodating step, first of all, an opening at the core front surface 12 side of the housing hole 90 is sealed with an adhesive tape 171 which can be peeled. The adhesive tape 171 is supported by a support table (not shown) provided with a heater (not shown). Next, a mounting device (manufactured by Yamaha Motor Co., Ltd.) is used to accommodate the IC chip 61 in the housing hole 90 such that the core front surface 12 and the chip front surface 62 are directed to the same direction and the core back surface 13 and the chip back surface 63 are directed to the same direction (see FIG. 4). At this time, the IC chip 61 is temporarily fixed by attaching the surface of each surface connecting terminal 65 onto an adhesive layer of the adhesive tape 171.

Figure 5:
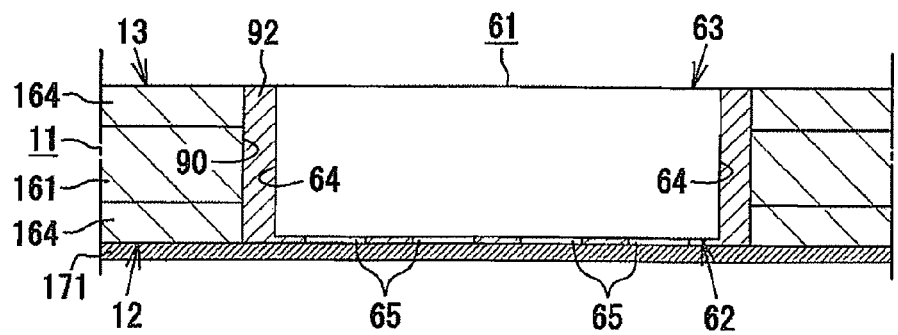
FIG. 5 is an explanatory view showing the method of manufacturing the wiring board.

At a subsequent filling step, a dispenser device (manufactured by Asymtek Co., Ltd.) is used to fill the resin filler 92 formed by a thermosetting resin (which is prepared by NAMICS CORPORATION) in the clearance between the housing hole 90 and the IC chip 61 (see FIG. 5).

The filling step may include a first filling step and a second filling step. In this case, at the first filling step, the heater of the support table is first operated to heat the support table at a lower temperature than a curing start temperature of the resin filler 92. It is advantageous that a temperature of the support table is equal to or lower than 100° C. and is set to be 100° C. in this embodiment. Without filling into clearances between the three chip side surfaces 64 and the internal wall surface of the housing hole 90, the liquid resin filler 92 (a first resin filler) is injected by using the dispenser device through only the clearance between one of the chip side surfaces 64 and the internal wall surface of the housing hole 90. Then, the resin filler 92 thus injected enters a portion between the adhesive tape 171 and the chip front surface 62 of the IC chip 61 by a capillarity and is moved along the chip front surface 62. At this time, air present between the chip front surface 62 and the adhesive tape 171 is pushed out of the housing hole 90 from the clearance between the chip side surface 64 and the internal wall surface of the housing hole 90 through the resin filler 92. The adhesive layer of the adhesive tape 171 is formed of a silicone based adhesive. Therefore, the resin filler 92 is smoothly moved over the adhesive tape 171. As a result, a clearance between the adjacent surface connecting terminals 65 is reliably filled with the resin filler 92. Therefore, it is possible to prevent a void from being caused by the air remaining in the housing hole 90. In addition, an end face at the core back surface 13 side of the resin filler 92 reaches a level of the chip front surface 62. At the subsequent second filling step, the liquid resin filler 92 (a second resin filler) is injected again into the clearance between the internal wall surface of the housing hole 90 and the chip side surface 64 of the IC chip 61 by using the dispenser device. Consequently, the clearance between the housing hole 90 and the IC chip 61 is filled and the end face at the core back surface 13 side of the resin filler 92 reaches levels of the core back surface 13 and the chip back surface 63.

At a subsequent fixing step, the resin filler 92 is cured to fix the IC chip 61 into the housing hole 90. More specifically, when a heat treatment is carried out at 120° C. for one hour, the resin filler 92 is cured so that the IC chip 61 is fixed to the core substrate 11. After the fixing step, the adhesive tape 171 is peeled. Then, the core front surface 12 and the core back surface 13 in the core substrate 11 and the surface of the surface connecting terminal 65 are roughened.

Figure 6:
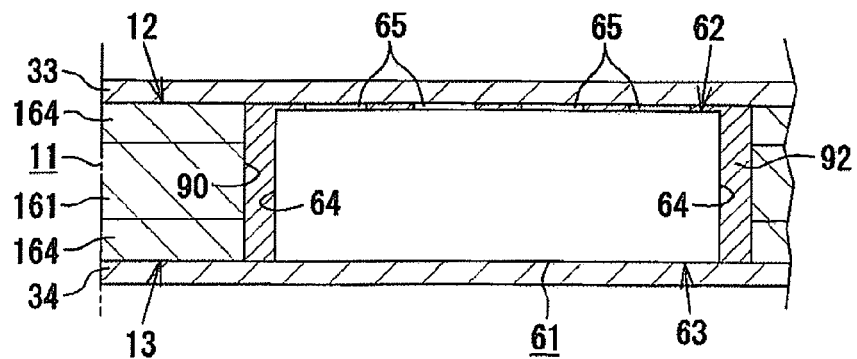
FIG. 6 is an explanatory view showing the method of manufacturing the wiring board.

Based on the conventional technique, next, the first built-up layer 31 is formed on the core front surface 12 and the second built-up layer 32 is formed on the core back surface 13. More specifically, first of all, a photosensitive epoxy resin is applied onto the core front surface 12 and the surface connecting terminal 65 to carry out an exposure and a development so that the insulating layer 33 is formed (see FIG. 6). Moreover, the photosensitive epoxy resin is applied onto the core back surface 13 and the chip back surface 63 to carry out the exposure and the development so that the insulating layer 34 is formed (see FIG. 6). An insulating resin or a liquid crystalline polymer (LCP: Liquid Crystalline Polymer) may be applied in place of the photosensitive epoxy resin.

Figure 7:
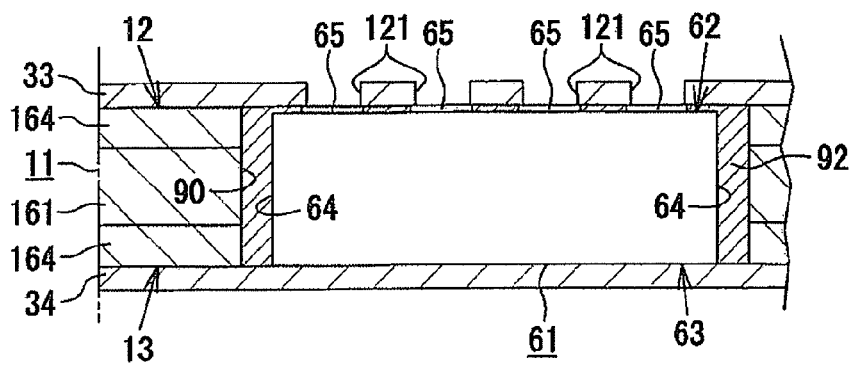
FIG. 7 is an explanatory view showing the method of manufacturing the wiring board.
Figure 8:
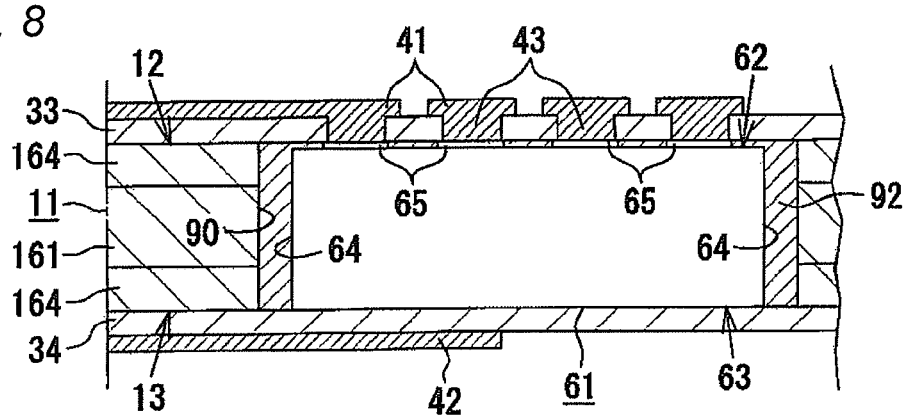
FIG. 8 is an explanatory view showing the method of manufacturing the wiring board.

Furthermore, laser perforating is carried out by using a YAG laser or a carbon dioxide gas laser to form a via hole 121 in a position in which the via conductor 43 is to be formed (see FIG. 7). More specifically, the via hole 121 penetrating the insulating layer 33 is formed and the surface of the protruded surface connecting terminal 65 is exposed to the chip front surface 62 of the IC chip 61. Furthermore, perforating is carried out using a drilling machine to form, in advance, a through hole (not shown) penetrating the core substrate 11 and the interlayer insulating layers 33 and 34 in given positions. Then, nonelectrolytic copper plating for the surfaces of the interlayer insulating layers 33 and 34, an internal surface of the via hole 121 and an internal surface of the through hole is carried out and an etching resist is then formed, and subsequently, electrolytic copper plating is performed. Furthermore, the etching resist is removed and soft etching is then carried out. Consequently, the wiring layer 41 is formed on the insulating layer 33 by patterning, and furthermore, the wiring layer 42 is formed on the insulating layer 34 by patterning (see FIG. 8). At the same time, the through hole conductor 16 is formed in the through hole and the via conductor 43 is formed in an inner part of each via hole. Thereafter, a cavity portion of the through hole conductor 16 is filled with an insulating resin material (an epoxy resin) to form the blocking body 17.

Figure 9:
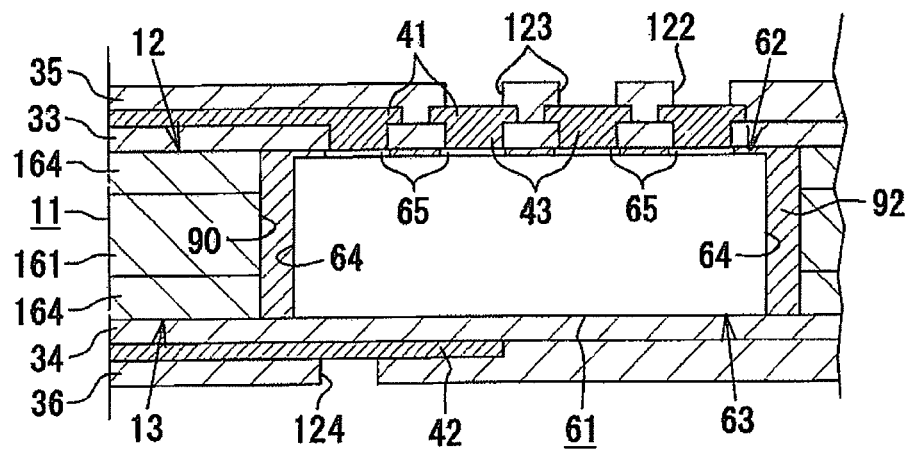
FIG. 9 is an explanatory view showing the method of manufacturing the wiring board.

Next, the photosensitive epoxy resin is applied onto the insulating layer 33 to carry out the exposure and the development, thereby forming the insulating layer 35 having a via hole 122 in a position in which the via conductor 43 is to be provided and a via hole 123 in a position in which the via conductor 44 is to be provided (see FIG. 9). Moreover, a photosensitive epoxy resin is applied onto the insulating layer 34 to carry out the exposure and the development, thereby forming the insulating layer 36 having a via hole 124 in a position in which the via conductor 47 is to be provided. An insulating resin or a liquid crystalline polymer may be applied in place of the photosensitive epoxy resin. In this case, the via holes 122 to 124 are formed in the positions in which the via conductors 43, 44 and 47 are to be provided by means of a laser processing machine. Next, a metal mask (not shown) having an opening portion for exposing the via hole 123 is disposed on the insulating layer 35. Then, a copper paste is printed into the via hole 123 through the metal mask to form the via conductor 44, and the metal mask is thereafter removed. Next, nonelectrolytic copper plating for the surfaces of the interlayer insulating layers 35 and 36 and internal surfaces of the via holes 122 and 124 is carried out and an etching resist is then formed, and subsequently, electrolytic copper plating is performed. Furthermore, the etching resist is removed to carry out soft etching. Consequently, the via conductors 43 and 47 are formed in the via holes 122 and 124, and furthermore, the conductor layers 41 and 42 are formed on the interlayer insulating layers 35 and 36 by patterning (see FIG. 10). The via conductors 43 and 47 and the conductor layers 41 and 42 are not provided after the formation of the via conductor 44 but the via conductor 44 may be provided after the formation of the via conductors 43 and 47 and the conductor layers 41 and 42.

Figure 10:
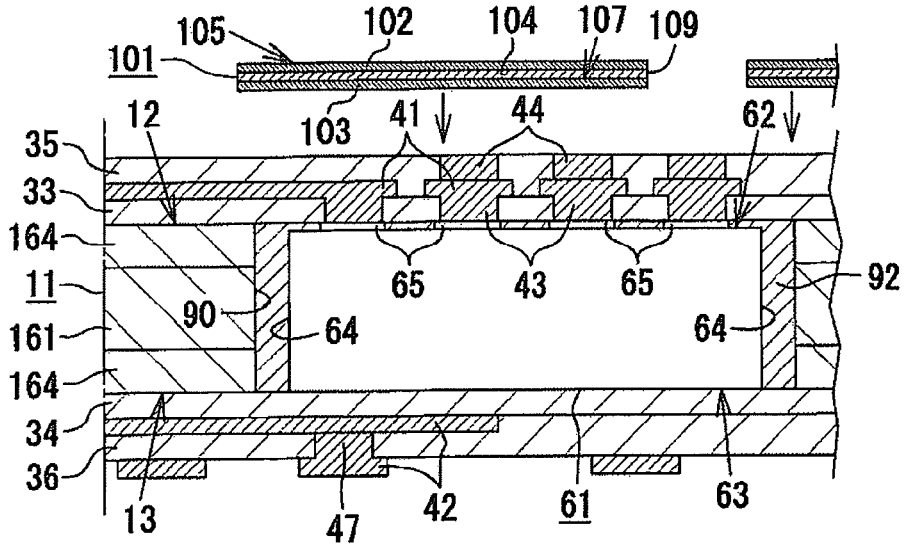
FIG. 10 is an explanatory view showing the method of manufacturing the wiring board.
Figure 11:
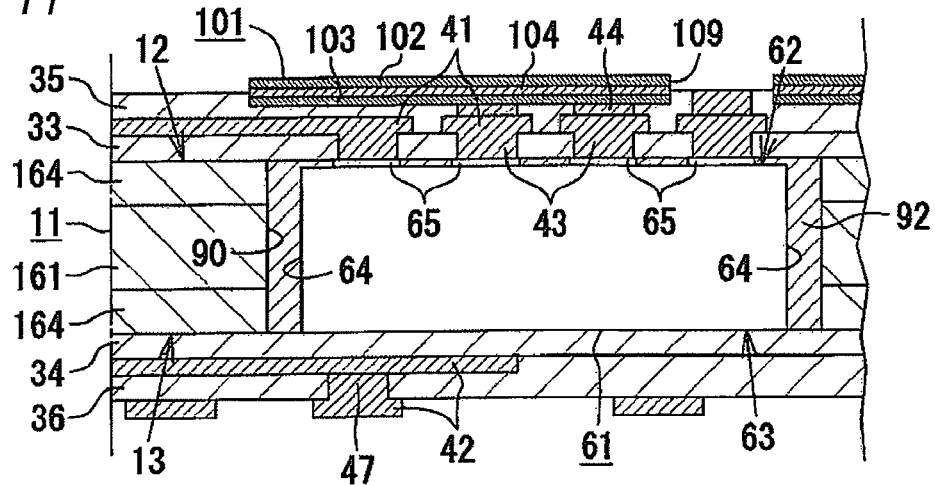
FIG. 11 is an explanatory view showing the method of manufacturing the wiring board.

Next, the ceramic capacitor 101 is mounted on the insulating layer 35 to be the second layer such that the first front surface 105 side of the first nickel electrode layer 102 and the first front surface 107 side of the second nickel electrode layer 103 are turned upward (see FIGS. 10 and 11).

In more detail, a mounter having a heating mechanism is used to mount the ceramic capacitor 101 on the insulating layer 35 and to press them at a certain pressure while carrying out heating at 180° C. for one minute. Consequently, a part of the insulating layer 35 enters the through hole 109 of the ceramic capacitor 101. Therefore, the ceramic capacitor 101 is reliably positioned (see FIG. 11). At this time, only a portion of the insulating layer 35 which is provided around the ceramic capacitor 101 is cured. After the ceramic capacitor 101 is mounted, a curing step of carrying out heating at 150° C. for 30 minutes is carried out to cure the insulating layer 35 and to sinter copper in the paste constituting the via conductor 44. Consequently, the ceramic capacitor 101 is supported and fixed to the insulating layer 35 to be the second layer, and furthermore, the second nickel electrode layer 103 of the ceramic capacitor 101 and the via conductor 44 are connected to each other.

Figure 12:
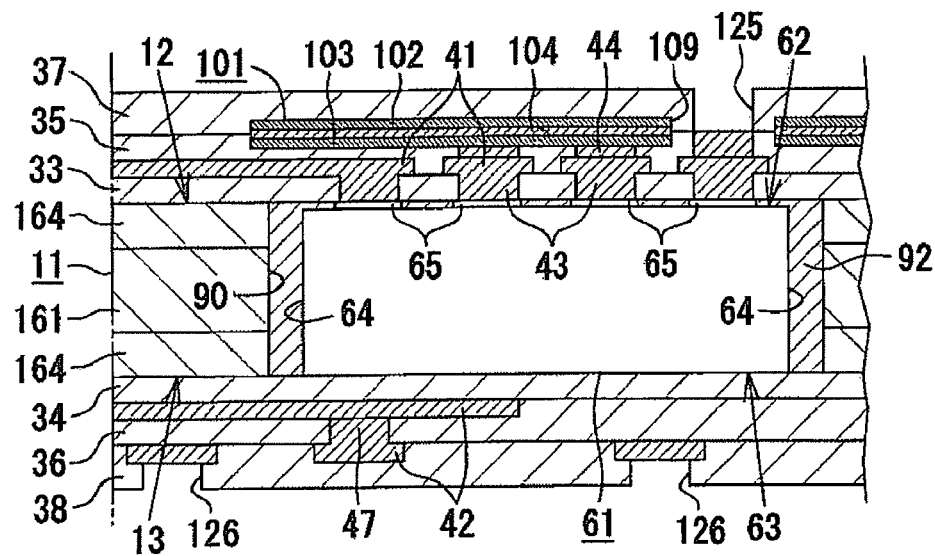
FIG. 12 is an explanatory view showing the method of manufacturing the wiring board.

Next, the photosensitive epoxy resin is applied onto the interlayer insulating layers 35 and 36 to carry out the exposure and the development, thereby forming the interlayer insulating layers 37 and 38 having via holes 125 and 126 in positions where the via conductors 43 and 47 are to be provided (see FIG. 12). An insulating resin or a liquid crystalline polymer may be applied in place of the photosensitive epoxy resin. In this case, the via holes 125 and 126 are formed in the positions where the via conductors 43 and 47 are to be provided by means of the laser processing machine. At this time, the ceramic capacitor 101 is perfectly embedded in the insulating layers 35 and 37. In accordance with a conventional technique, next, electrolytic copper plating is carried out to form the via conductors 43 and 47 in the via holes 125 and 126. Thus, the terminal pads 23, 24 and 27 are formed on the insulating layer 37 and the pad 48 for BGA is formed on the insulating layer 38.

Subsequently, the photosensitive epoxy resin is applied onto the interlayer insulating layers 37, 38, respectively, and is cured to form the solder resists 50 and 51. Next, the exposure and the development are carried out with a mask disposed so that the opening portions 40 and 46 are formed on the solder resists 50 and 51 by patterning. Furthermore, the solder bumps 25, 26 and 28 are formed on the terminal pads 23, 24 and 27 and the solder bump 49 is formed on the pad 48 for a BGA. It is possible to grasp that the state provides a wiring board group in which a plurality of product regions to be the wiring board 10 are arranged vertically and transversely in a planar direction. When the wiring board group is divided into plural, a large number of wiring boards 10 as individual products are obtained at the same time.

Then, the IC chip 21 is mounted on the component mounting region 20 of the first built-up layer 31 constituting the wiring board 10. At this time, the surface connecting terminal 22 on the IC chip 21 side and the solder bumps 25, 26 and 28 are aligned with each other. Heating is carried out at a temperature of approximately 220° C. to 240° C. so that the solder bumps 25, 26 and 28 are subjected to reflow process. Consequently, the solder bumps 25, 26 and 28 and the surface connecting terminal 22 are bonded to each other, and the wiring board 10 side and the IC chip 21 side are electrically connected to each other. As a result, the IC chip 21 is mounted on the component mounting region 20 (see FIG. 1).

According to the exemplary embodiment, therefore, it is possible to obtain the following advantages.

(1) According to the wiring board 10 in accordance with the exemplary embodiment, the ceramic capacitor 101 is embedded in the first built-up layer 31. Consequently, the wiring for connecting the IC chip 61 housed in the housing hole 90 to the ceramic capacitor 101 is shortened and the wiring for connecting the IC chip 21 mounted on the component mounting region 20 to the ceramic capacitor 101 is shortened. Therefore, it is possible to prevent an increase in the inductance component of the wiring. Accordingly, it is possible to reliably reduce switching noises of the IC chips 21 and 61 through the ceramic capacitor 101 and to surely stabilize a power voltage. Moreover, the noise entering the portion between the IC chip 61 and the ceramic capacitor 101 and the portion between the IC chip 21 and the ceramic capacitor 101 can be reduced very greatly. Therefore, it is possible to obtain a high reliability without causing a drawback such as malfunction.

(2) In the exemplary embodiment, the signal wiring 111 for electrically connecting the IC chip 61 to the IC chip 21 is disposed in the through hole 109 of the ceramic capacitor 101. Consequently, the signal wiring 111 is shortened. Therefore, the noise entering the portion between the IC chips 21 and 61 can be reduced very greatly. Consequently, it is possible to obtain a high reliability without causing a drawback such as malfunction. Moreover, the signal wiring 111 is disposed in the through hole 109 so that the wiring is densely provided in the wiring board 10. Thus, it is possible to reduce the size of the wiring board 10.

(3) In the exemplary embodiment, a difference in a coefficient of thermal expansion is generated between the IC chip 61 embedded in the wiring board 10 and the other portions (the core substrate 11 and the buildup layers 31, 32) in the wiring board 10. Therefore, there is a possibility that the IC chip 61 might be broken due to an application of a great force to the vicinity thereof. In the exemplary embodiment, however, the wiring board 10 includes the ceramic capacitor 101 having a coefficient of thermal expansion which is closer to that of the IC chip 61 than the core substrate 11 and the buildup layers 31 and 32. Consequently, the difference in the coefficient of thermal expansion is reduced, so that a great force can be suppressed in the vicinity of the IC chip 61.

The exemplary embodiment according to the invention may be modified in the following manner.

Figure 13:
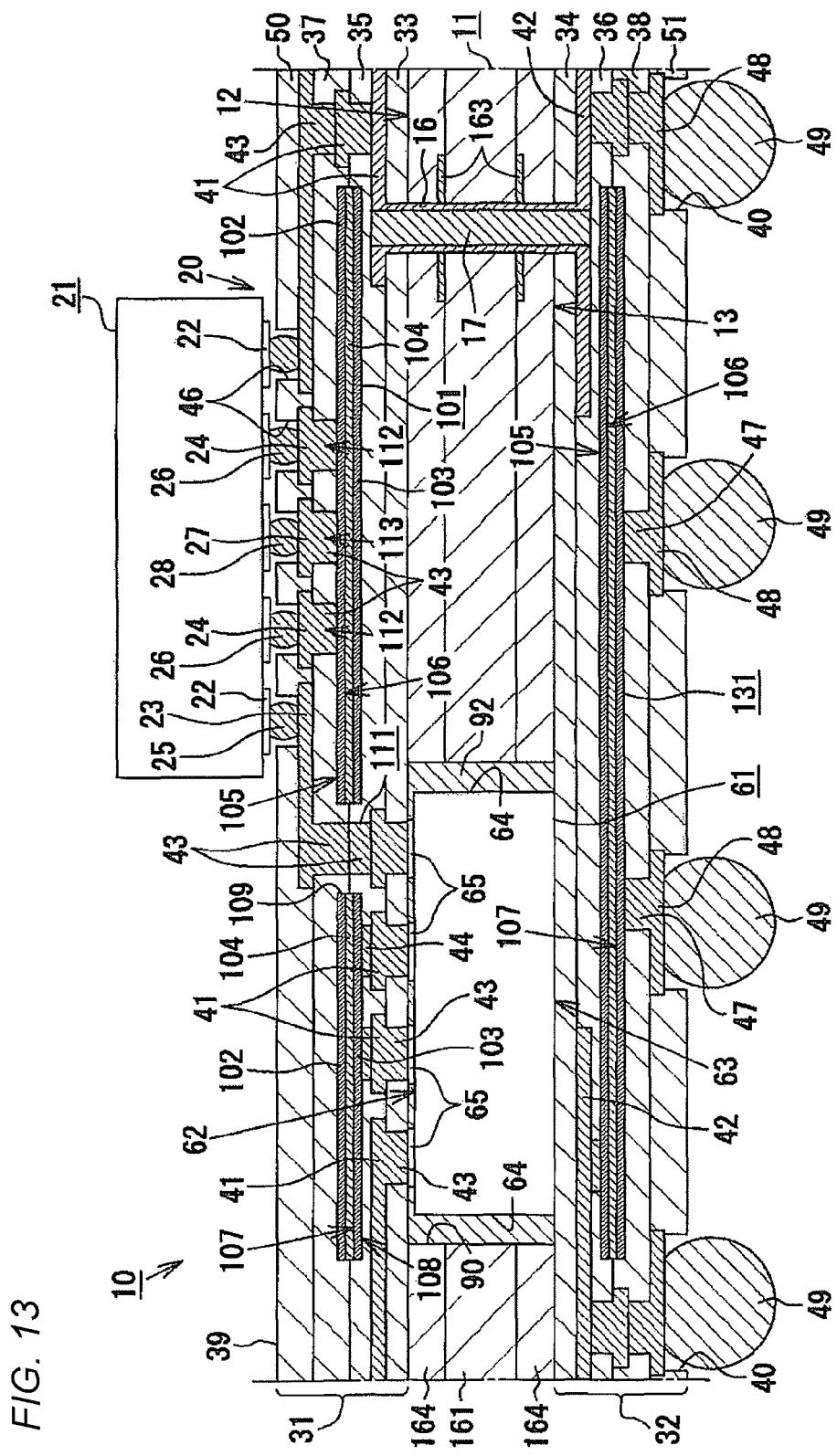
FIG. 13 is a schematic sectional view showing a wiring board according to another exemplary embodiment of the present invention.

In the exemplary embodiment, the ceramic capacitor 101 is embedded in only the first built-up layer 31. However, the ceramic capacitor may be embedded in only the second built-up layer 32. As shown in FIG. 13, moreover, the ceramic capacitors 101 and 131 may be embedded in both the first built-up layer 31 and the second built-up layer 32.

Figure 14:
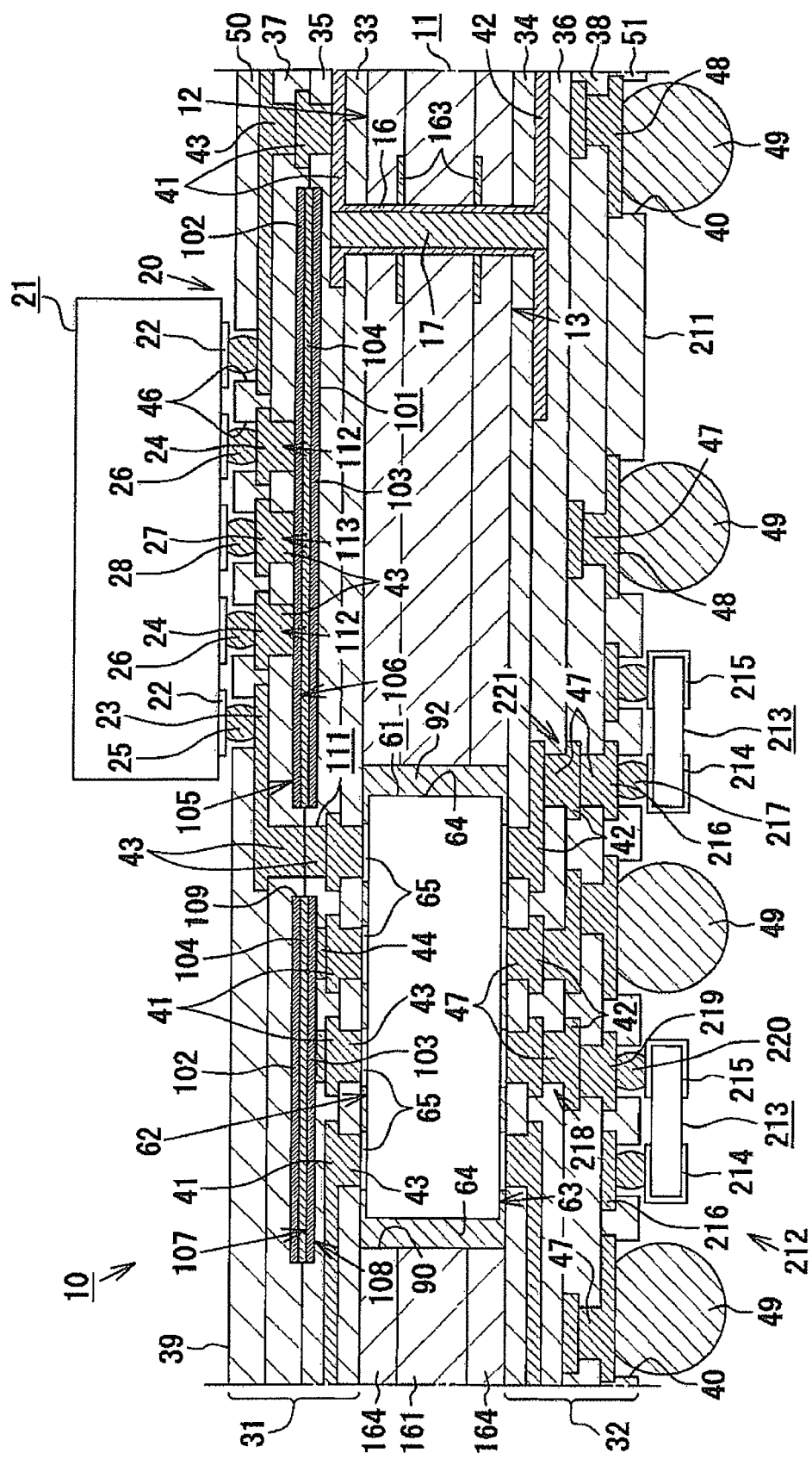
FIG. 14 is a schematic sectional view showing a wiring board according to still another exemplary embodiment of the present invention.

As shown in FIG. 14, a component mounting portion 212 may be provided to a surface 211 of the second built-up layer 32 (or the surface 39 of the first built-up layer 31) and a surface mounting component such as a chip capacitor 213 or a register (not shown) may be mounted on the component mounting portion 212. In this case, the IC chip 61 and a power terminal present in the component mounting portion 212 (a power pad 216 and a power solder bump 217) are electrically connected to each other through a power wiring 218 (a wiring constituted by the wiring layer 42 and the via conductor 47) provided in the second built-up layer 32. Moreover, the IC chip 61 and a ground terminal present in the component mounting portion 212 (a ground pad 219 and a ground solder bump 220) are electrically connected to each other through a ground wiring 221 (a wiring constituted by the wiring layer 42 and the via conductor 47) provided in the second built-up layer 32. The chip capacitor 213 has a structure in which a power internal electrode layer and a ground internal electrode layer are alternately formed through a dielectric layer, for example. A pair of side surfaces opposed to each other in the chip capacitor 213 are provided with a power electrode 214 to be connected to the power internal electrode layer and the power solder bump 217 and a ground electrode 215 to be connected to the ground internal electrode layer and the ground solder bump 220, respectively. When a DRAM is provided in the housing hole 90 in place of the IC chip 61 according to the exemplary embodiment, a power supplying capacitor does not need to have a large capacity. Therefore, only the chip capacitor 213 can supply a power to the DRAM.

In the exemplary embodiment, the through hole 109 having the circular shape when seen in the thickness direction of the ceramic capacitor 101 is formed in a plurality of places in the ceramic capacitor 101. However, the number and shape of the through holes is not particularly restricted thereto.

Figure 15:
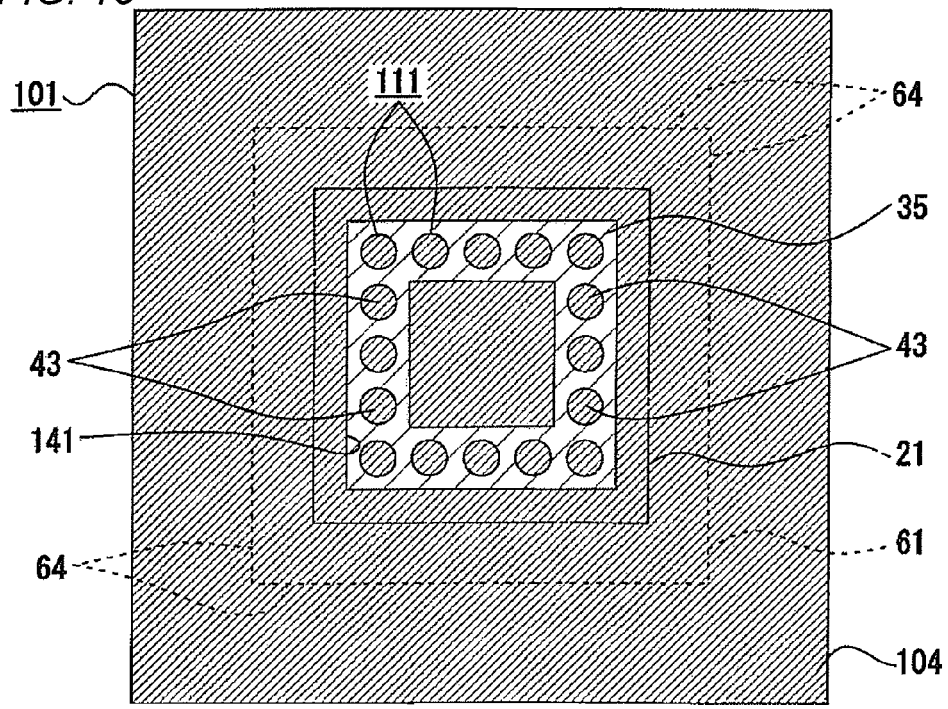
FIG. 15 is an explanatory view showing a positional relationship between a ceramic capacitor and an IC chip according to the another exemplary embodiment of the present invention.

For example, when the IC chip 61 is disposed below the IC chip 21 and the ceramic capacitor 101 is embedded in the vicinity of the component mounting region 20 in the first built-up layer 31, each signal wiring 111 is disposed in the same manner as the surface connecting terminal 22 for a signal. For example, when the surface connecting terminal 22 for a signal is formed like a ring, the signal wiring 111 is also formed like a ring as shown in FIG. 15. In this case, it is advantageous to form a through hole 141 having a ring shape when seen from the thickness direction of the ceramic capacitor 101 in one place of the ceramic capacitor 101 and to dispose all of the signal wirings 111 in the through hole 141. In this case, the ceramic capacitor 101 is electrically independent on an inside region and an outside region of the through hole 141. Accordingly, the first nickel electrode layer 102 forming the outside region of the ceramic capacitor 101 may be electrically connected to the power surface connecting terminal 65 of the IC chip 61. Moreover, the second nickel electrode layer 103 forming the outside region of the ceramic capacitor 101 may be electrically connected to the ground surface connecting terminal 65 of the IC chip 61. The first nickel electrode layer 102 is electrically connected to the power surface connecting terminal 65 via an outside of the ceramic capacitor 101, e.g., through the via conductor 43 and the front side wiring layer 41. An electric potential of a power line of the IC chip 61 is instantaneously reduced due to a switching noise made through a high-speed ON/OFF operation. However, it is possible to reliably suppress the reduction in the electric potential of the power line by connecting the ceramic capacitor 101 in the vicinity of the IC chip 61 with the IC chip 61 and decoupling the ceramic capacitor 101.

Figure 16:
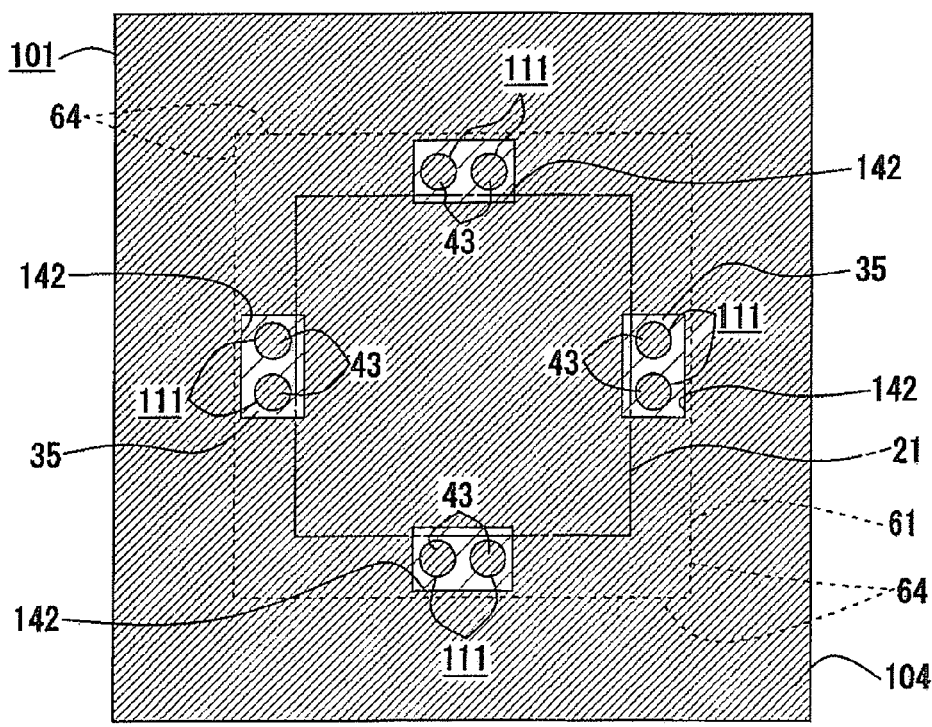
FIG. 16 is an explanatory view showing a positional relationship between a ceramic capacitor and an IC chip according to the still another exemplary embodiment of the present invention.

When the IC chip 61 is disposed below the IC chip 21 and the ceramic capacitor 101 is embedded in the vicinity of the core front surface 12 in the first built-up layer 31, moreover, the respective signal wirings 111 are disposed apart from each other because they are subjected to fan-out. In this case, as shown in FIG. 16, it is advantageous to form a through hole 142 having a rectangular shape when seen from the thickness direction of the ceramic capacitor 101 in a plurality of places (four places in FIG. 16) of the ceramic capacitor 101 and to dispose the respective through holes 142 apart from each other. It is advantageous to dispose a plurality of (two in FIG. 16) signal wirings 111 in each of the through holes 142.

Although the IC chip 61 has been used as the first component to be housed in the housing hole 90 of the core substrate 11 in the exemplary embodiment, other components such as an IC chip (a DRAM or an SRAM), a chip capacitor or a register may be used as the first component. Although the IC chip 21 has been used as the second component to be mounted on the component mounting region 20 in the exemplary embodiment, similarly, other components such as an IC chip (a DRAM or an SRAM), a chip capacitor or a register may be used as the second component.

In the ceramic capacitor 101 according to the exemplary embodiment, the single dielectric layer 104 and the two nickel electrode layers 102 and 103 are laminated. However, it is also possible to change the numbers of the dielectric layers 104 and the nickel electrode layers 102 and 103.

While the present invention has been shown and described with reference to certain example embodiments, other implementations are within the scope of the claims. It will be understood by those skilled in the art that various changes in form and details may be made therein without departing from the spirit and scope of the invention as defined by the appended claims.

What is claimed is:

1. A component built-in wiring board, comprising:
a core substrate having a core front surface and a core back surface opposite to the core front surface, the core substrate comprising a housing hole opened on at least the core front surface side;
a first component having a component front surface and a component back surface opposite to the component front surface, wherein the first component is housed in the housing hole such that the core front surface and the component front surface are directed to the same direction;
a first built-up layer formed on the core front surface of the core substrate, the first built-up layer comprising a plurality of insulating layers and a plurality of wiring layers, wherein a surface of the first built-up layer has a component mounting region on which a second component electrically connected to the first component is mounted;
a second built-up layer formed on the core back surface of the core substrate, the second built-up layer comprising a plurality of insulating layers and a plurality of wiring layers; and
a capacitor comprising: an electrode layer; and a dielectric layer formed on a major surface of the electrode layer, wherein the capacitor is embedded in at least one of the first built-up layer and the second built-up layer such that the major surface is in parallel with a surface of the at least one of the first built-up layer and the second built-up layer;
wherein an external dimension of the capacitor is larger than that of the first component and that of the component mounting region,
wherein the first component and the component mounting region are included in an embedded region in which the capacitor is embedded, when viewed from a thickness direction of the component built-in wiring board;
wherein a signal terminal pad is formed in the component mounting region,
wherein the capacitor has a through hole therethrough,
wherein a signal wiring is provided in the first built-up layer such that the signal wiring is provided in the through hole without contacting the capacitor, and
wherein the first component is electrically connected to the signal terminal pad via the signal wiring.

2. The component built-in wiring board according to claim 1, wherein a power terminal pad and a ground terminal pad are formed in the component mounting region,
wherein the capacitor is electrically connected to the power terminal pad via a power wiring provided in the first built-up layer,
wherein the capacitor is electrically connected to the ground terminal pad via a ground wiring provided in the first built-up layer.

3. The component built-in wiring board according to claim 1,
wherein either a surface of the first built-up layer or a surface of the second built-up layer has another component mounting region on which a surface mounting component is mounted,
wherein a power terminal pad and a ground terminal pad are formed in the another component mounting region,
wherein the first component is electrically connected to the power terminal pad via a power wiring provided in either the first built-up layer or the second built-up layer,
wherein the first component is electrically connected to the ground terminal pad via a ground wiring provided in either the first built-up layer or the second built-up layer.

* * * * *